US012648304B2

(12) United States Patent
Wang

(10) Patent No.: US 12,648,304 B2
(45) Date of Patent: Jun. 2, 2026

(54) DISPLAY PANEL

(71) Applicants: Huizhou China Star Optoelectronics Display Co., Ltd., Huizhou (CN); Shenzhen China Star Optoelectronics Semiconductor Display Technology Co., Ltd., Shenzhen (CN)

(72) Inventor: Guojie Wang, Huizhou (CN)

(73) Assignees: Huizhou China Star Optoelectronics Display Co., Ltd., Huizhou (CN); Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 615 days.

(21) Appl. No.: 18/090,548

(22) Filed: Dec. 29, 2022

(65) Prior Publication Data

US 2024/0049514 A1 Feb. 8, 2024

(30) Foreign Application Priority Data

Aug. 3, 2022 (CN) .......................... 202210927795.5

(51) Int. Cl.
*H10K 59/122* (2023.01)
*H10K 59/121* (2023.01)
*H10K 59/35* (2023.01)
*H10K 71/13* (2023.01)
(52) U.S. Cl.
CPC ....... *H10K 59/122* (2023.02); *H10K 59/1213* (2023.02); *H10K 59/352* (2023.02); *H10K 59/353* (2023.02); *H10K 71/135* (2023.02)

(58) Field of Classification Search
CPC ... H10K 59/353; H10K 59/352; H10K 59/122
See application file for complete search history.

(56) References Cited

U.S. PATENT DOCUMENTS 12,238,974 B2 2/2025 Cui
2010/0270912 A1* 10/2010 Ko ........................ H10K 59/353
313/504

(Continued)

FOREIGN PATENT DOCUMENTS

CN 108511493 9/2018
CN 110429101 A * 11/2019 ............. B82Y 40/00
(Continued)

OTHER PUBLICATIONS

Machine translation, Gao, Chinese Pat. Pub. No. CN110429101A, translation date: May 17, 2025, Espacenet, all pages. (Year: 2025).*

(Continued)

*Primary Examiner* — Victoria K. Hall

(57) ABSTRACT

The present application provides a display panel. By arranging a plurality of sub-pixels in the display panel into the same pixel opening, the number of pixel openings in the display area can be reduced, and the number of ink droplets that can be sprayed in a single pixel opening can be increased, thereby the risk of color mixing of adjacent sub-pixels can be reduced, and at the same time, the number of times of inkjet printing can be reduced, the time of inkjet printing can be shortened, and the production efficiency can be improved.

8 Claims, 8 Drawing Sheets

(56)               References Cited

U.S. PATENT DOCUMENTS

| | | | |
|---|---|---|---|
| 2014/0197385 A1* | 7/2014 | Madigan | H10K 59/122 |
| | | | 438/34 |
| 2015/0364712 A1* | 12/2015 | Lee | H10K 59/353 |
| | | | 257/40 |
| 2016/0276615 A1* | 9/2016 | Kitabayashi | H10K 59/30 |
| 2021/0083016 A1* | 3/2021 | Yamabuchi | H05B 33/10 |
| 2022/0223668 A1* | 7/2022 | Cui | H10K 59/352 |
| 2024/0265860 A1* | 8/2024 | Sang | H10K 59/352 |

FOREIGN PATENT DOCUMENTS

| | | | | |
|---|---|---|---|---|
| CN | 111293152 | 6/2020 | | |
| KR | 10-2016-0067544 A | * 6/2016 | | H10K 59/00 |

OTHER PUBLICATIONS

The State Intellectual Property Office of People's Republic of China, The First Office Action, Chinese Pat. App. No. 202210971713. 7, Feb. 27, 2025, all pages. (Year: 2025).*
The State Intellectual Property Office of People's Republic of China, The Second Office Action, Chinese Pat. App. No. 202210927795. 5, Jul. 24, 2025, all pages. (Year: 2025).*
The State Intellectual Property Office of People's Republic of China, The Third Office Action, Chinese Pat. App. No. 202210927795. 5, Oct. 9, 2025, all pages. (Year: 2025).*
Machine translation, Joo, Korean Pat. Pub. No. KR20160067544A, translation date: May 17, 2025, Espacenet, all pages. (Year: 2025).*
Notification of Office Action and Search Report Dated Feb. 22, 2025 From The State Intellectual Property Office of the People's Republic of China Re. Application No. 202210927795.5 and Its Translation Into English. (20 Pages).

* cited by examiner

DISPLAY PANEL

FIELD OF INVENTION

The invention relates to the field of display panels, and particularly to a display panel.

BACKGROUND

Ink jet printing (IJP) technology has good application prospects in the fabrication of light-emitting layers of active-matrix organic light-emitting diode (AMOLED) display panels. Ink jet printing technology is to directly drop-coat the ink containing organic light-emitting materials into the prefabricated pixel definition layer and form the desired pattern after the solvent is volatilized. The pixel definition layer includes a plurality of pixel openings arranged in an array, and the pixel openings are used to confine the ink. After drying and baking, the ink shrinks to form a thin film within the range restricted by the pixel openings.

As the resolution of the display panel increases, the pixel design becomes smaller and smaller, which requires higher and higher precision in inkjet printing. The accuracy and drop volume of inkjet printing are becoming more and more difficult to control. The current printing accuracy requires accurate optimization of position, droplet size, and number of droplets before printing the required substrate. If these are not properly adjusted, it is possible that the ink in the adjacent pixel openings will overflow and mix together during the inkjet printing process, resulting in the phenomenon of color mixing.

To sum up, the prior art has problems of color mixing due to poor accuracy of inkjet printing and difficulty in controlling the amount of ink droplets. Therefore, it is necessary to provide a display panel to improve this defect.

Technical Solution

Embodiments of the present invention provide a display panel, which can improve the problem of color mixing due to poor inkjet printing accuracy and difficulty in controlling the amount of ink droplets.

In an embodiment of the present application, the present application provides a display panel comprising a display area, and the display panel further comprises:

a base substrate;

an anode layer disposed on the base substrate, wherein the anode layer comprises a plurality of first anodes, a plurality of second anodes, and a plurality of third anodes;

a pixel definition layer disposed on a side of the anode layer away from the base substrate, wherein the pixel definition layer is provided with a first pixel opening, a second pixel opening and a third pixel opening, the first pixel opening extends from one end of the display area to an opposite end of the display area along a row direction, and the second pixel opening and the third pixel opening and the first pixel opening are arranged in different rows;

a light-emitting layer respectively disposed in the first pixel opening, the second pixel opening and the third pixel opening; and a cathode layer disposed on a side of the light-emitting layer away from the base substrate, wherein the first pixel opening is provided with the plurality of the first anodes arranged at intervals along the row direction, the second pixel opening is provided with the plurality of the second anodes, and the third pixel opening is provided with the plurality of the third anodes.

According to an embodiment of the present application, at least two of the plurality of the second anodes are arranged at intervals in the second pixel opening along the column direction, and the third pixel opening is provided with at least two of the plurality of the third anodes arranged at intervals along the column direction.

According to an embodiment of the present application, the display area is provided with a plurality of first opening rows and a plurality of second opening rows that are alternately arranged in sequence along the column direction, wherein the plurality of first opening rows are provided with one of the plurality of first pixel openings, and the plurality of second opening rows are provided with the plurality of second pixel openings and the plurality of the third pixel opening.

According to an embodiment of the present application, the plurality of second pixel openings in any one of the plurality of second opening rows are staggered from the plurality of second pixel openings in the adjacent second opening row, and the plurality of the third pixel openings in any one of the plurality of second opening rows are staggered from the plurality of the third pixel openings in the adjacent second opening rows.

According to an embodiment of the present application, centerlines of the plurality of the first anodes in the adjacent first opening rows are overlapped.

According to an embodiment of the present application, the center lines of the first anodes in at least one of the plurality of first opening rows and a vertical line of a horizontal connection line of the adjacent second anode and the third anode in the plurality of second opening rows are overlapped.

According to an embodiment of the present application, a width of the plurality of first pixel openings along the column direction is different from a width of the plurality of second pixel openings along the column direction, and the width of the plurality of first pixel openings along the column direction is different from the width of the plurality of third pixel openings along the column direction.

According to an embodiment of the present application, the width of the plurality of first pixel openings along the column direction is smaller than the width of the plurality of second pixel openings along the column direction, and the width of the plurality of second pixel openings along the column direction is the same as the width of the plurality of third pixel opening along the column direction.

According to an embodiment of the present application, a length of the plurality of second pixel openings along a row direction is smaller than a length of the plurality of third pixel openings along the row direction.

According to an embodiment of the present application, a distance between the plurality of first pixel openings and the plurality of second pixel openings or the plurality of third pixel openings along the column direction is between the between 10 μm and 16 μm.

According to an embodiment of the present application, a distance between the second pixel opening and the third pixel opening adjacent in the row direction is between 15 μm and 25 μm.

According to an embodiment of the present application, colors of light respectively emitted by the light emitting layer corresponding to the first pixel opening, the second pixel opening, and the third pixel opening are different.

According to an embodiment of the present application, the display panel further comprises a driving circuit layer, the driving circuit layer is arranged on the base substrate, and the anode layer is arranged on a side of the driving circuit from away from the base substrate, wherein the driving circuit layer comprises a plurality of thin film transistors, and the plurality of first anodes, the plurality of the second anodes and the plurality of the third anodes are respectively electrically connected to the corresponding different thin film transistors.

Beneficial effects of the embodiments of the present application are that the embodiments of the present application provide a display panel, and the display panel includes a display area, and the display panel further includes a base substrate, an anode layer disposed on the base substrate, and an anode layer disposed on the base substrate. A pixel definition layer disposed on a side of the anode layer away from the base substrate, the anode layer includes a plurality of first anodes, second anodes and third anodes, and a first pixel opening, a second anode and a third anode are arranged on the pixel definition layer. A second pixel opening and a third pixel opening, the first pixel opening extending from one end of the display area to the opposite end of the display area in the row direction, the second pixel opening and the third pixel opening, and the first pixel opening are arranged in different rows. The first pixel opening is provided with a plurality of the first anodes arranged at intervals along the row direction, and the second pixel opening is provided with the first anodes, the third anodes are provided in the third pixel opening. Through collecting the plurality of first anodes arranged at intervals along the row direction in the same first pixel opening, the number of first pixel openings in the display area can be reduced and increase the number of ink droplets that can be sprayed in a single first pixel opening, thereby reducing the risk of color mixing between adjacent pixel openings and the number of inkjet printing times, shortening inkjet printing time, and improving productivity.

BRIEF DESCRIPTION OF DRAWINGS

To detailly explain the technical schemes of the embodiments or existing techniques, drawings that are used to illustrate the embodiments or existing techniques are provided. The illustrated embodiments are just a part of those of the present disclosure. It is easy for any person having ordinary skill in the art to obtain other drawings without labor for inventiveness.

DETAILED DESCRIPTION

Figure 1:
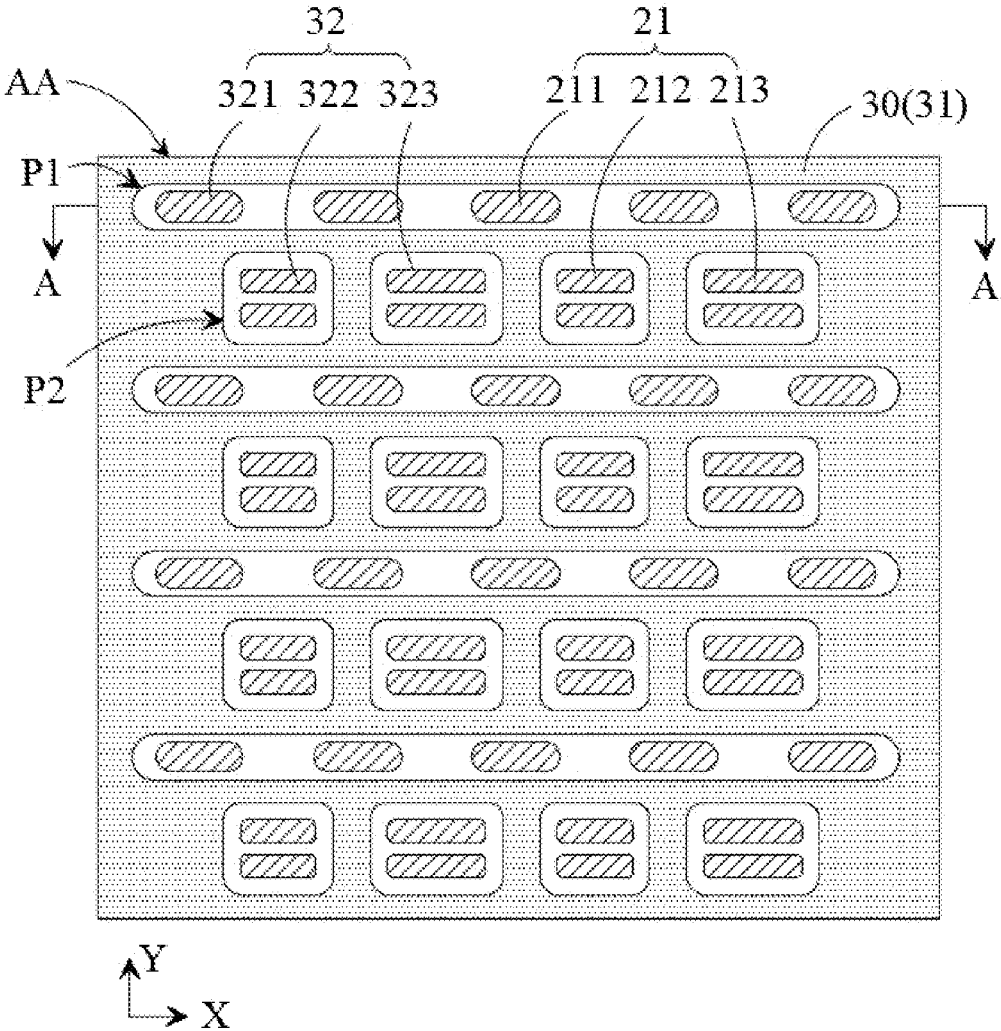
FIG. 1 is a schematic plan view of a first display panel provided by an embodiment of the present application.

Technical solutions in the embodiments of the present invention will be clearly and completely described below with reference to the accompanying drawings in the embodiments of the present invention. In the description of the present invention, it should be understood that the terms "center", "longitudinal", "lateral", "length", "width", "thickness", "upper", "lower", "front", "rear", "left", "right", "vertical", "horizontal", "top", "bottom", "inside", "outside", "clockwise", "counterclockwise", etc refer to the orientation of the accompanying drawings. The terms are only for of describing the present invention, rather than indicating or implying that the referred device or element must have a specific orientation, or be constructed and operated in a specific orientation, Therefore, it should not be construed as a limitation of the present invention. In the accompanying drawings, structurally similar elements are denoted by the same reference numerals.

The present application will be further described below with reference to the accompanying drawings and specific embodiments.

Embodiments of the present application provide a display panel, which can improve the problems of color mixing caused by poor inkjet printing accuracy and difficulty in controlling the amount of ink droplets.

Figure 2:
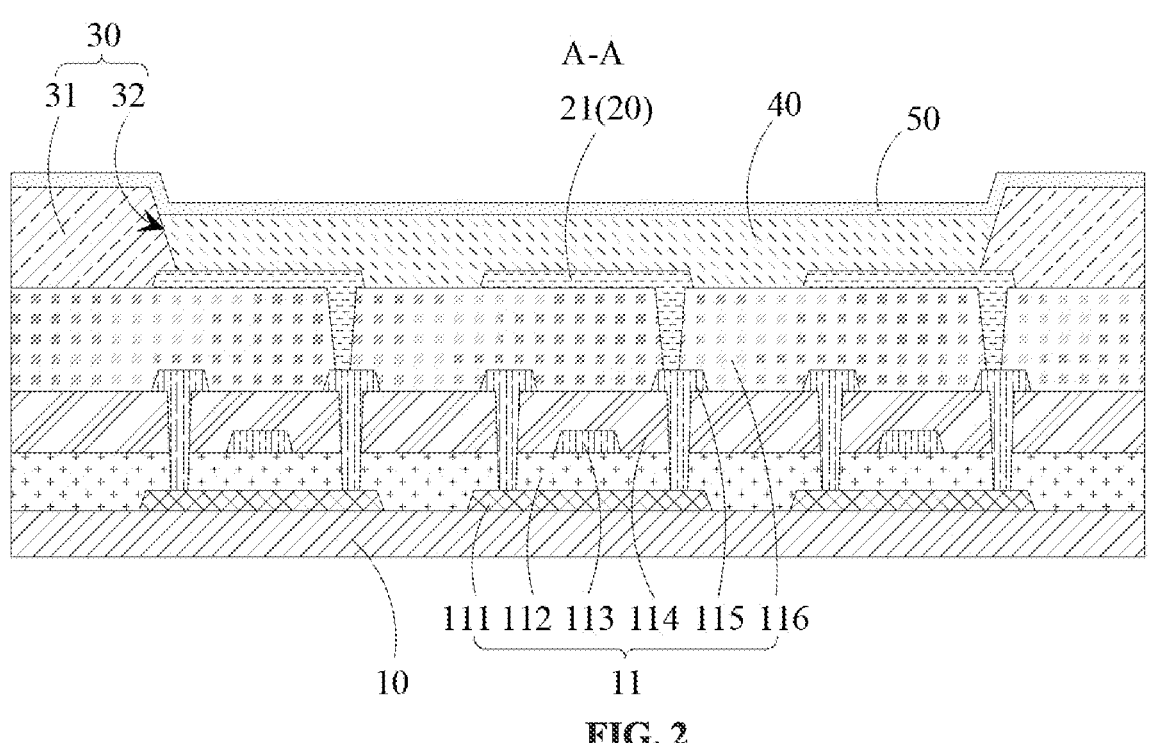
FIG. 2 is a cross-sectional view of the first display panel along the A-A direction provided by the embodiment of the present application.

In combination of illustrations of FIG. 1 and FIG. 2, FIG. 1 is a schematic plan view of the first display panel provided by the embodiment of the application, and FIG. 2 is a cross-sectional view of the first display panel provided by the embodiment of the application along the A-A direction. The display panel comprises a base substrate 10, an anode layer 20 and a pixel definition layer 30. The anode layer 20 is disposed on the base substrate 10, and the pixel definition layer 30 is disposed on a side of the anode layer 20 away from the pixel definition layer 30.

It should be noted that, being disposed on the base substrate 10 may refer to direct contact with the base substrate 10 or may refer to indirect contact with the base substrate 10.

In the embodiments of the present application, the base substrate 10 may be a rigid substrate, such as glass, and the base substrate may also be a flexible substrate, such as polyimide.

In the embodiment of the present application, the display panel further comprises a driving circuit layer 11, and the driving circuit layer 11 is disposed on a side of the anode layer facing the base substrate 10.

The driving circuit layer 11 may comprise, but is not limited to, an active layer 111, a gate insulating layer 112, a gate metal layer 113, an interlayer dielectric layer 114, a source-drain electrode metal layer 115 and a protective layer 116.

The driving circuit layer 11 may include a plurality of thin film transistors, storage capacitors, and a plurality of thin film transistors, storage capacitors and a metal wiring, the thin film transistor, the storage capacitor and the metal wiring can constitute a pixel driving circuit.

It should be noted that FIG. 2 only illustrates the connection relationship between the thin film transistors in the driving circuit layer 11 and each anode in the anode layer 20 and does not represent the film layer structure of the driving circuit layer 11 in practical applications. The film structure of the driving circuit layer 11 may be any film structure of the driving circuit layer 11 in the prior art, which is not limited here.

The anode layer 20 comprises a plurality of patterned anodes 21, and the plurality of patterned anodes 21 are arranged in an array on the driving circuit layer 11.

The pixel definition layer 30 is provided with a dam 31 and a pixel opening 32 surrounded by the dam 31. The pixel opening 32 penetrates the pixel definition layer 30 along a thickness direction of the pixel definition layer 30 to expose the anode 21 under the pixel definition layer 30.

The display panel further comprises a plurality of light-emitting layers 40. The plurality of light-emitting layers 40 can be used to emit light of various colors. Each of the light-emitting layers 40 is respectively disposed in the corresponding pixel opening 32. In some embodiments, each light-emitting layer 40 covers all the anodes 21 in the pixel openings 32.

It should be noted that the display panel may further comprise a common layer (not shown in the figure), and the common layer may comprise a hole injection layer, a hole transport layer, an electron transport layer and an electron injection layer that are stacked, so the light-emitting layer 40 may be disposed between the hole transport layer and the electron transport layer. The common layer can be fabricated by methods including but not limited to full-surface evaporation or inkjet printing.

The display panel further comprises a cathode layer 50 disposed on a side of the light-emitting layer 40 away from the base substrate 10.

In the embodiment of the present application, at least two anodes 21 are disposed in each of the pixel openings 32, and the light-emitting layer 40 fills the pixel openings 32 to cover all the anodes 21 exposed by the pixel openings 32. The portion of the light-emitting layer 40 that overlaps the anode 21 may emit light, and the portion of the light-emitting layer 40 that does not overlap the anode 21 may not emit light. In this way, the light-emitting layer 40 in the same pixel opening 32 can be divided into a plurality of mutually independent light-emitting units, and the area where each light-emitting unit is located can be regarded as a sub-pixel. The number of the sub-pixels is equal to the number of the anodes 21 arranged in the pixel opening 32.

It should be noted that the overlapping portion may refer to the portion where the light emitting layer 40 and the anode 21 overlap each other along the thickness direction of the display panel.

Taking FIG. 2 as an example, the pixel opening 32 is provided with three anodes 21, and the light-emitting layer 40 in the pixel opening 32 can be divided into three mutually independent light-emitting units. That is, the pixel opening 32 is provided with three subpixels that emit light of the same color.

It should be noted that FIG. 2 only illustrates the film layer structure of the display panel, and the number of anodes 21 in the pixel opening 32 shown in FIG. 2 does not represent the number of anodes 21 in the actual application of the pixel opening 32.

Figure 3:
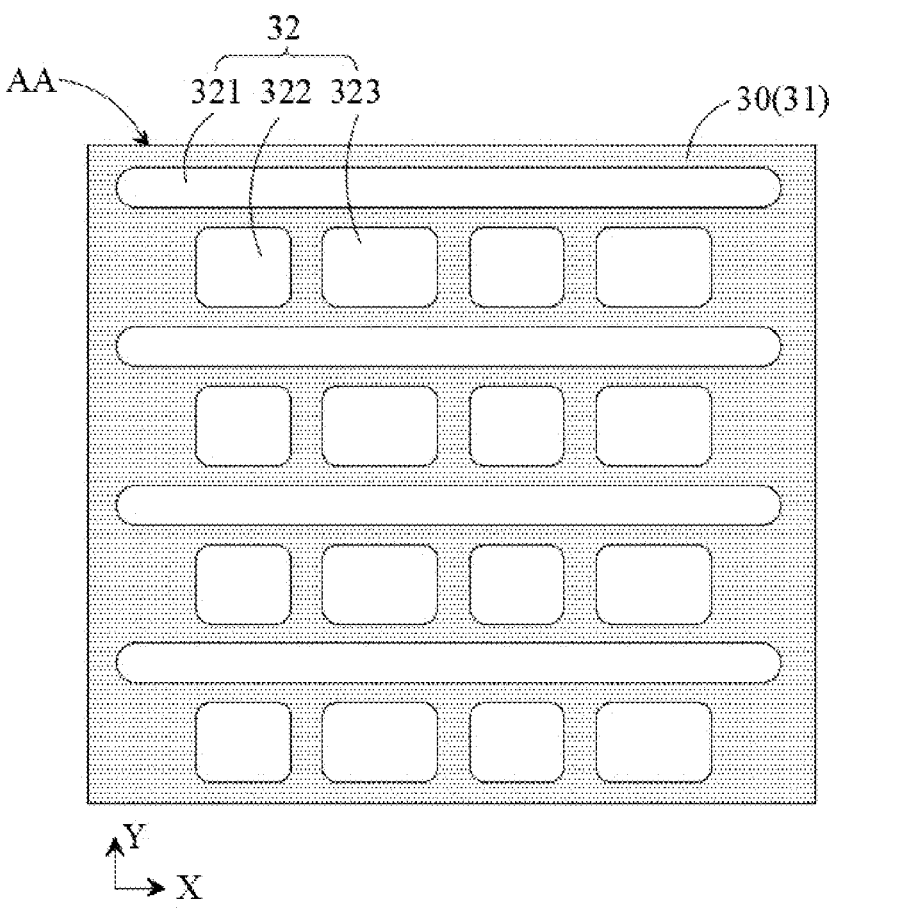
FIG. 3 is a schematic plan view of a first pixel definition layer provided by an embodiment of the present application.

In an embodiment of the present application, as shown in FIG. 3, which is a schematic plan view of a first pixel definition layer provided by the embodiment of the present application, the pixel opening 32 comprises a plurality of first pixel openings 321, a plurality of second pixel openings 322 and a plurality of third pixel openings 323.

The display panel comprises a display area AA, and the display area AA refers to an area on a front surface of the display panel capable of displaying a screen image. The first pixel openings 321, the second pixel openings 322 and the third pixel openings 323 are all disposed in the display area AA.

The first pixel openings 321 are in a strip shape, and the first pixel openings 321 can extend from one end of the display area AA to the opposite end of the display area AA along a row direction X. There is only one of first pixel openings 321 in the row where the first pixel opening 321 is located, and the plurality of the first pixel openings 321 may be arranged at intervals along a column direction Y.

It should be noted that, the row direction X may refer to a horizontal transverse direction in the top view shown in FIG. 1, and the column direction Y may refer to a vertical longitudinal direction in the top view shown in FIG. 1.

The second pixel openings 322 and the third pixel openings 323 are disposed in different rows from the first pixel openings 321. The plurality of the second pixel openings 322 may be arranged at intervals along the row direction X in the same row, and the plurality of the third pixel openings 323 may be arranged at intervals in the same row along the row direction X. The second pixel openings 322 and the third pixel openings 323 may be arranged in the same row or may be arranged in different rows.

Figure 4:
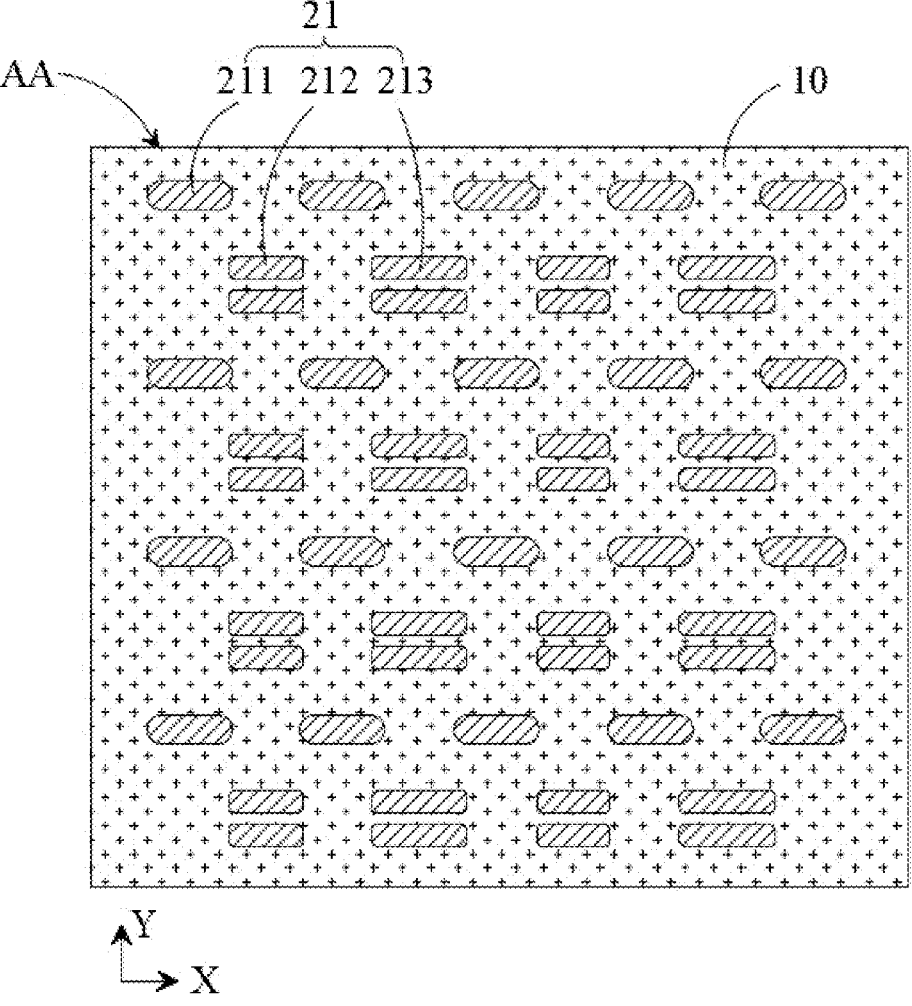
FIG. 4 is a schematic plan view of a first anode layer provided in an embodiment of the present application.

As shown in FIG. 4, which is a schematic plan view of a first anode layer provided in an embodiment of the application, the plurality of anodes 21 may comprise a plurality of patterned first anodes 211, second anodes 212 and third anodes 213. The plurality of the first anodes 211, the second anodes 212 and the third anodes 213 are arranged in an array on the base substrate 10. The first anodes 211, the second anodes 212 and the third anodes 213 are respectively electrically connected to the corresponding different driving thin film transistors in the driving circuit layer 11.

Furthermore, the first pixel openings 321 are provided with the first anodes 211, the second pixel openings 322 are provided with the second anodes 212, and the third pixel openings 323 are provided with the third anodes 213. The first anodes 211 are arranged at intervals along the row direction X.

Furthermore, the second pixel openings 322 are provided with at least two second anode electrodes 212 arranged at intervals along the column direction Y, and the third pixel openings 323 are provided with at least two third anodes 213 arranged at intervals along the column direction Y.

In one embodiment, as shown in FIG. 1 and FIG. 3, the first pixel openings 321 are provided with a row of the plurality of the first anodes 211 arranged at intervals along the row direction X, and the pixel openings 322 are provided with two second anode electrodes 212 arranged at intervals along the column direction Y, and the third pixel openings 323 are provided with two third anode electrodes 213 arranged at intervals along the column direction Y.

Furthermore, a plurality of the light emitting layers 40 are respectively disposed in the first pixel openings, the second pixel openings and the third pixel openings. The corresponding colors of the light-emitting layers in the first pixel openings, the second pixel openings and the third pixel openings are different from each other.

In one embodiment, the light-emitting layers 40 may comprise a red light-emitting layer, a green light-emitting layer and a blue light-emitting layer. The red light-emitting layer is provided in the first pixel openings 321, the green light-emitting layer is provided in the second pixel openings 322, and the blue light-emitting layer is provided in the third pixel openings 323.

It should be noted that the red light-emitting material in the existing red light-emitting layer has high light-emitting efficiency, and it is necessary to reduce the size of the pixel opening corresponding to the red sub-pixel to reduce the size of the red sub-pixel, so that the brightness of the red sub-pixel is close to the brightness of the blue sub-pixel and the green sub-pixel, so as to prevent the display screen of the display panel from appearing reddish. However, reducing the size of the pixel opening will increase the precision requirements of inkjet printing, thereby increasing the difficulty of inkjet printing and the risk of color mixing of adjacent sub-pixels, resulting in poor display problems caused by color mixing on the display panel.

In an embodiment of the present application, by collecting all the red sub-pixels in the same row in the same first pixel opening 321, the dam for separating different red sub-pixels can be omitted, and the ink material for inkjet printing can flow freely in the first pixel opening 321. The printing nozzles of the same row on the inkjet printing device can be used to spray the red ink material, which can not only improve the efficiency of inkjet printing, but also avoid the occurrence of the problems of color mixing caused by the overflow of the ink material.

It should be noted that the size of the pixel openings corresponding to the existing green sub-pixels and blue sub-pixels is limited, and the direction of inkjet printing is the same as the column direction Y. Along the direction of inkjet printing, only a limited number of ink droplets can be sprayed in the pixel openings, resulting in the need for multiple printings to spray the corresponding color ink material in the pixel openings corresponding to each green sub-pixel and blue sub-pixel. Since more and longer time is needed, the efficiency of inkjet printing is low.

In the embodiment of the present application, by disposing at least two of the second anodes 212 adjacent in the column direction Y in the same second pixel opening 322, the banks separating two adjacent sub-pixels the column direction Y are not needed any more, which increases the width of the second pixel openings 322 in the column direction Y. Thus, the ink droplets sprayed in the second pixel openings 322 during each printing process can be increased. This can reduce the number and time of inkjet printing and improve the efficiency of inkjet printing.

Based on the same principle, by arranging at least two adjacent third anodes 213 in the same third pixel opening 323 along the column direction Y, the width of the third pixel opening 323 along the column direction Y can also be enlarged and the number of ink droplets sprayed in the third pixel opening 323 during each printing process is increased, thereby reducing the number and time of inkjet printing and improving the efficiency of inkjet printing.

In some other embodiments, in addition to disposing the red light-emitting layer in the first pixel openings 321, a blue light-emitting layer or a green light-emitting layer may also be disposed in the first pixel openings 321, and the light-emitting layer of other colors is disposed on the second pixel openings 322 or the third pixel opening 323, which is not limited here.

Furthermore, the display area is provided with a first opening row and a second opening row that are alternately arranged in sequence along the column direction. The first opening row is provided with one of the first pixel openings, and the second opening row is provided with a plurality of the second pixel openings and the third pixel openings that are arranged alternately in sequence along the row direction.

As shown in FIG. 1, the display area AA is provided with a first opening row P1 and a second opening row P2 which are alternately arranged in sequence along the column direction Y. One of the first pixel openings 321 is provided in the first opening row P1, and the first pixel opening 321 is provided with a row of the first anodes 211.

The second opening row P2 is provided with a plurality of the second pixel openings 322 and the third pixel openings 323 that are alternately arranged in sequence along the row direction X. The first opening row P1 and the second opening row P2 constitute the smallest repeating unit along the column direction Y.

It should be noted that, only four repeating units along the column direction Y are shown in FIG. 4.

In the embodiment shown in FIG. 1, the second pixel openings 322 in each of the second opening rows P2 are arranged in the same column in the column direction Y, and the third pixel openings 322 in each of the second opening rows P2 are arranged in the same column.

The red sub-pixels in the first opening row P1 can be borrowed by the blue sub-pixels and green sub-pixels in the second opening row P2 on the upper and lower sides to form a complete pixel unit.

As shown in FIG. 1, the green sub-pixel corresponding to the second anode 212 located on upper side of the second pixel opening 322, the blue sub-pixel corresponding to the third anode 213 located on upper side of the third pixel opening 323, and the red sub-pixel corresponding to the above first anode 211 in the first pixel opening 321 and located above and between the two above sub-pixels can form a pixel unit. The green sub-pixel corresponding to the second anode 212 located on lower side of the second pixel opening 322, the blue sub-pixel corresponding to the third anode 213 located on lower side of the third pixel opening 323, and the red sub-pixels corresponding to the first anode 211 in the first pixel opening 321 and located below and between the two above sub-pixels can form a pixel unit.

In one of the embodiments, the second pixel openings in any one of the second opening rows are staggered from the second pixel openings in the adjacent second opening row, and the third pixel openings in any one of the second opening rows are staggered from the third pixel openings in the adjacent second opening row.

Figure 5:
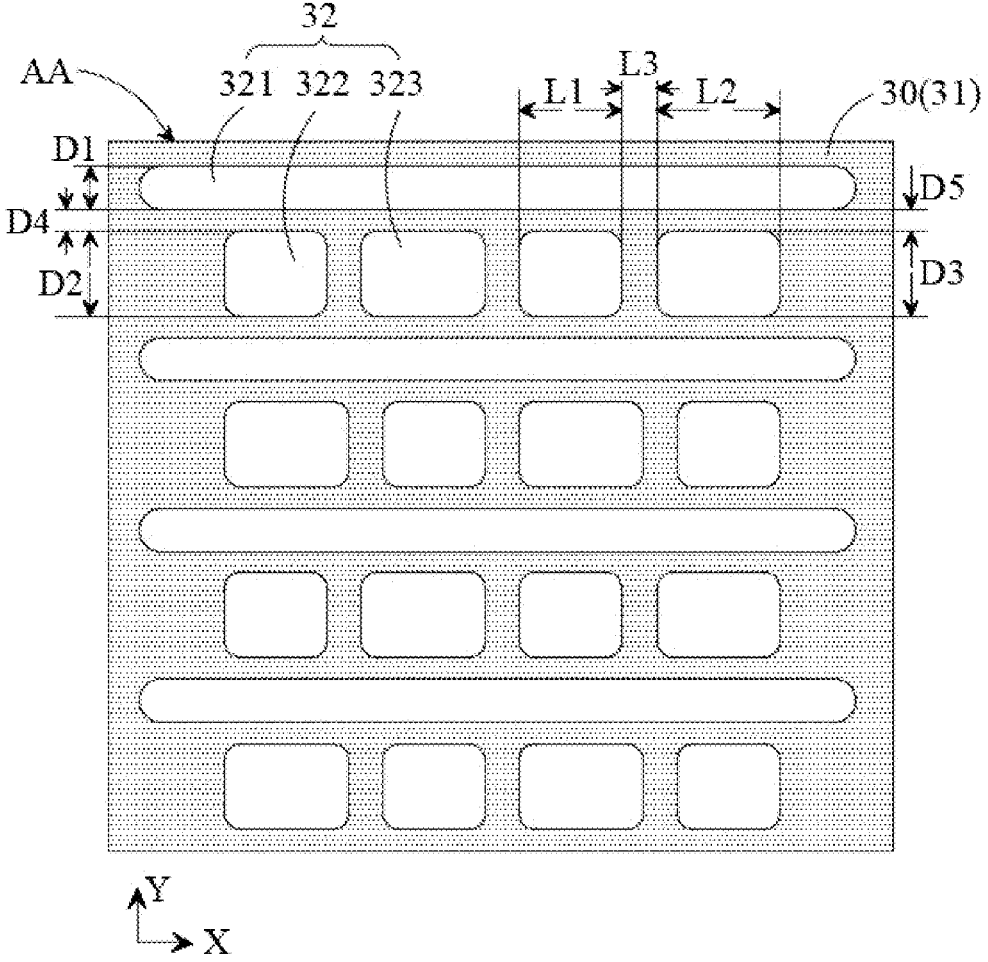
FIG. 5 is a schematic plan view of a second pixel definition layer provided by an embodiment of the present application.
Figure 6:
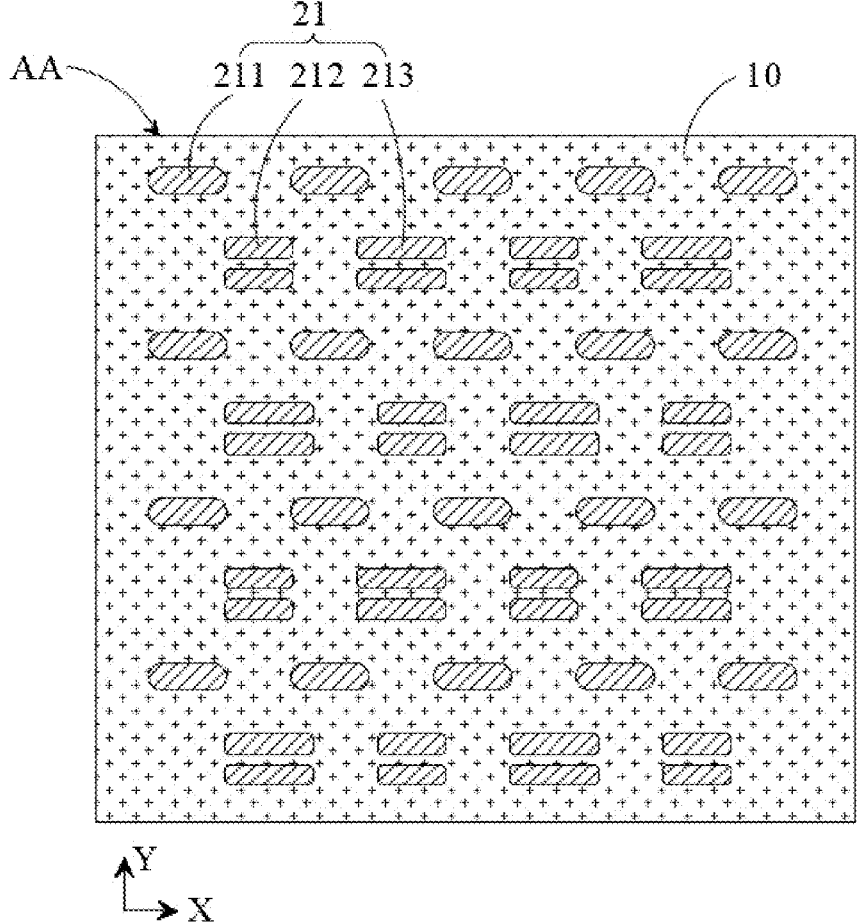
FIG. 6 is a schematic plan view of a second anode layer provided in an embodiment of the present application.
Figure 7:
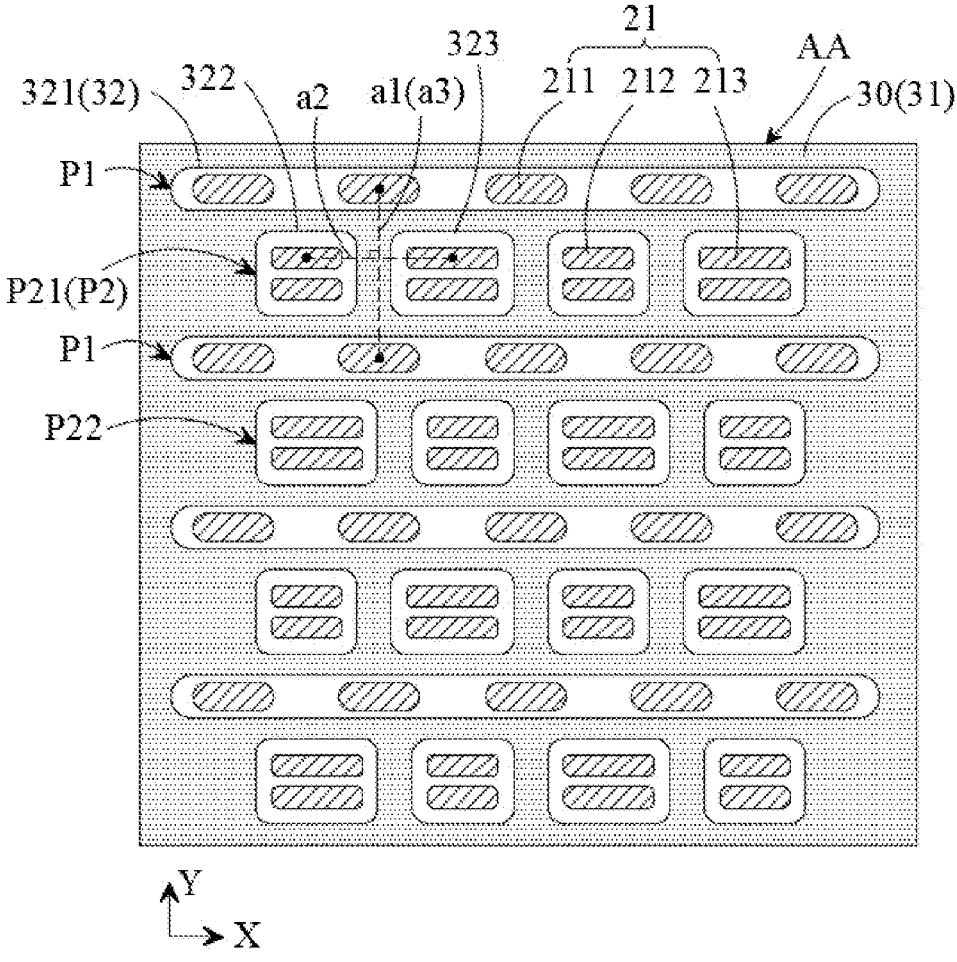
FIG. 7 is a schematic plan view of a second display panel according to an embodiment of the present application.

Please refer to FIGS. 5-7, FIG. 5 is a schematic plan view of a second pixel definition layer provided by an embodiment of the present application, FIG. 6 is a schematic plan view of a second anode layer provided by an embodiment of the present application, and FIG. 7 is a schematic plan view of a second display panel provided by the embodiment. The structure of the embodiment shown in FIGS. 5-7 is substantially the same as that of the embodiments shown in FIGS. 1-4, the difference therebetween is that the plurality of second opening rows P2 can be divided into a first sub-opening row P21 and a sub-opening row P22, and a first sub-opening row P1 is disposed between the first sub-opening row P21 and the second sub-opening row P22.

Along the column direction Y, one of the first opening rows P1, the first sub-opening row P21, the other first opening row P1, and the second sub-opening row P22 which are arranged in sequence constitute the smallest repeating unit, and the smallest repeating unit can be repeatedly arranged along the column direction Y. FIG. 7 only illustrates two repeating units along the column direction Y, and the arrangement of the subsequent repeating units may refer to FIG. 7, which will not be repeated here.

As shown in FIG. 7, a plurality of the second pixel openings 322 and the third pixel openings 323 are arranged alternately in sequence along the row direction X in the first sub-opening row P21. A plurality of the third pixel openings 323 and the second pixel openings 322 are arranged alternately in sequence along the row direction X in the second sub-opening row P22.

The second pixel openings 322 in the first sub-opening row P21 are arranged in the same column with the third pixel openings 323 in the second sub-opening row P22, and are staggered with the second pixel openings 322 in the second sub-opening row P22. The third pixel openings 323 in the first sub-opening row P21 are arranged in the same column with the second pixel openings 322 in the second sub-opening row P22, and are staggered with the third pixel openings 323 in the second sub-opening row P22.

It should be noted that, with reference to FIG. 3, since two green sub-pixels are collected in each of the second pixel openings 322, if the second pixel openings 322 in each of the second opening rows P2 are arranged in the same column, there will be too many green sub-pixels located in the same column along the column direction Y, which may cause the display screen to have more obvious green stripes along the column direction Y.

Similarly, if the third pixel openings 323 in each of the second opening rows P2 are arranged in the same column, there may be relatively obvious blue stripes along the column direction Y on the display screen.

In the embodiments shown in FIGS. 5-7, the second pixel openings 322 in the adjacent two second opening rows P2 are staggered and the third pixel openings 323 in the adjacent two second opening rows P2 are staggered, which can avoid agglomeration of many green sub-pixels or blue sub-pixels in the same column of sub-pixels, thereby improving the color uniformity of the display image.

Further, the centerlines of the first anodes in adjacent rows of the first openings are overlapped.

As shown in FIG. 7, the centerline of the first anodes 211 in the first opening row P1 is a1, and the centerlines of the first anodes 211 in the two adjacent first opening rows P1 in the figure are overlapped. It can be considered that the corresponding two first anodes 211 in the two adjacent first opening rows P1 are in the same column.

Furthermore, the center line of the first anode in at least one of the first opening rows and the vertical line of the horizontal connection line between the adjacent second anodes and the third anodes in the plurality of second opening rows are overlapped.

As shown in FIG. 7, taking the second first anode 211 in the first opening row P1 as an example, the center line of the first anode 211 is a1, and the horizontal connection line between the second anode 212 and the third anode 213 adjacent to each other along the row direction X in the first sub-opening row P21 is a2, the vertical line of the horizontal connection a2 is a3, and the center line a1 of the first anode 211 and the vertical line a3 of the horizontal connection line a2 of the second anode 212 and the third anode 213 are overlapped.

In one embodiment, there may be only one center line a1 of the first anode 211 in the first opening row P1 and the vertical line a3 of the horizontal connection line a2 of the adjacent second anodes 212 and the third anode 213 in the plurality of the second opening rows P2 are overlapped.

In one embodiment, as shown in FIG. 7, the center line a1 of the first anodes 211 in each of the first opening rows P1 and the vertical line a3 of the horizontal connection line a2 of the second anode electrode 212 and the third anode electrode 213 of the adjacent first anodes 211 in the plurality of second opening rows P2 are overlapped.

Furthermore, the width of the first pixel opening along the column direction is different from the width of the second pixel opening along the column direction, and the width of the first pixel opening along the column direction is different from the width of the third pixel opening along the column direction.

In one embodiment, as shown in FIG. 5, the width D1 of the first pixel opening 321 along the column direction Y is smaller than the width D2 of the second pixel opening 322 along the column direction Y, so the width D1 of the first pixel opening 321 along the column direction Y can be reduced and the width D2 of the second pixel opening 322 along the column direction Y can be increased, thereby increasing the size of the second pixel opening 322 and the number of drops of ink material can be printed, so that the efficiency of inkjet printing can be improved.

In one embodiment, the width D2 of the second pixel opening 322 along the column direction Y is the same as the width D3 of the third pixel opening 323 along the column direction Y, and the length L1 of the second pixel opening 322 along the row direction X is smaller than the length L2 of the third pixel opening 323 along the row direction X. In this way, the area of the third pixel opening 323 can be made larger than the area of the second pixel opening 322. Due to the poor service life of the blue light-emitting material, in the case of the same width as the second pixel opening 322, the area of the third pixel opening 323 is increased through increasing the length of the third pixel opening 323, thereby increasing the capacity of the blue light-emitting material in the third pixel opening 323 and the service life of the blue pixels, and improving the service life of the display panel.

In one embodiment, the length of the first pixel opening 321 along the row direction X can be 803520 micrometers, and the width D1 of the first pixel opening 321 along the column direction Y can be 30 micrometers. The length L1 of the second pixel opening 322 along the row direction X can be 140 micrometers, and the width D2 of the second pixel opening 322 along the column direction Y can be 86 micrometers. The length L2 of the third pixel opening 323 along the row direction X can be 160 micrometers, and the width D3 of the third pixel opening 323 in the column direction Y can be 86 micrometers.

In one embodiment, taking a 65-inch display panel as an example, one of the second pixel openings 322 and one of the adjacent third pixel openings 323 along the row direction X may constitute a minimum repeating unit. Along the row direction X, there can be 4320 repeating units in the display area AA. Along the column direction Y, the display area AA may be provided with 7680 repeating units constituted by the first opening row P1, the first sub-opening row P21, another first opening row P1 and the second sub-opening row P22.

In one embodiment, the width D2 of the second pixel opening 322 along the column direction Y may be smaller than the width D3 of the third pixel opening 323 along the column direction Y. The length L1 of the second pixel opening 322 along the row direction X is equal to the length L2 of the third pixel opening 323 along the row direction X, which can also ensure that the area of the third pixel opening 323 is larger than that of the second pixel opening 322 area.

In one embodiment, the width D2 of the second pixel opening 322 along the column direction Y may be equal to the width D3 of the third pixel opening 323 along the column direction Y. The length L1 of the second pixel opening 322 along the row direction X is equal to the length L2 of the third pixel opening 323 along the row direction X. That is, the area of the third pixel opening 323 is equal to the area of the second pixel opening 322.

Furthermore, the distance between the first pixel opening and the adjacent second pixel opening or the third pixel opening along the column direction is between 10 μm and 16 μm.

In one embodiment, as shown in FIG. 5, the distance D4 between the first pixel opening 321 and the adjacent second pixel opening 322 along the column direction Y is the same as the distance D5 between the first pixel opening 321 and the adjacent third pixel openings 323 along the column direction Y.

The distance D4 between the first pixel openings 321 and the adjacent second pixel openings 322 along the column direction Y may be 10 micrometers, 12 micrometers, 14 micrometers, or 16 micrometers. In the case of a certain resolution, it can be avoided that the size of the first pixel opening 321 or the second pixel opening 322 is compressed due to the excessively large distance between the first pixel opening 321 and the second pixel opening 322. The risk of color mixing of the luminescent materials in the first pixel opening 321 and the second pixel opening 322 can also be reduced.

Furthermore, the distance between the second pixel opening and the adjacent third pixel opening along the row direction is between 15 micrometers and 25 micrometers.

In one embodiment, the distance L3 between the second pixel openings 322 and the adjacent third pixel openings 323 along the row direction X may be 15 μm, 17 μm, 19 μm, 20 μm, 22 μm, 24 μm or 25 μm, etc. In the case of a certain resolution, the distance L3 between the second pixel opening 322 and the adjacent third pixel opening 323 along the row direction X can be restricted to be between 15 μm and 25 μm so that excessive spacing compressing to the sizes of the second pixel opening 322 and the third pixel opening 323 can be avoided, thereby preventing the problem of color mixing between adjacent pixel openings along the row direction X.

Figure 8:
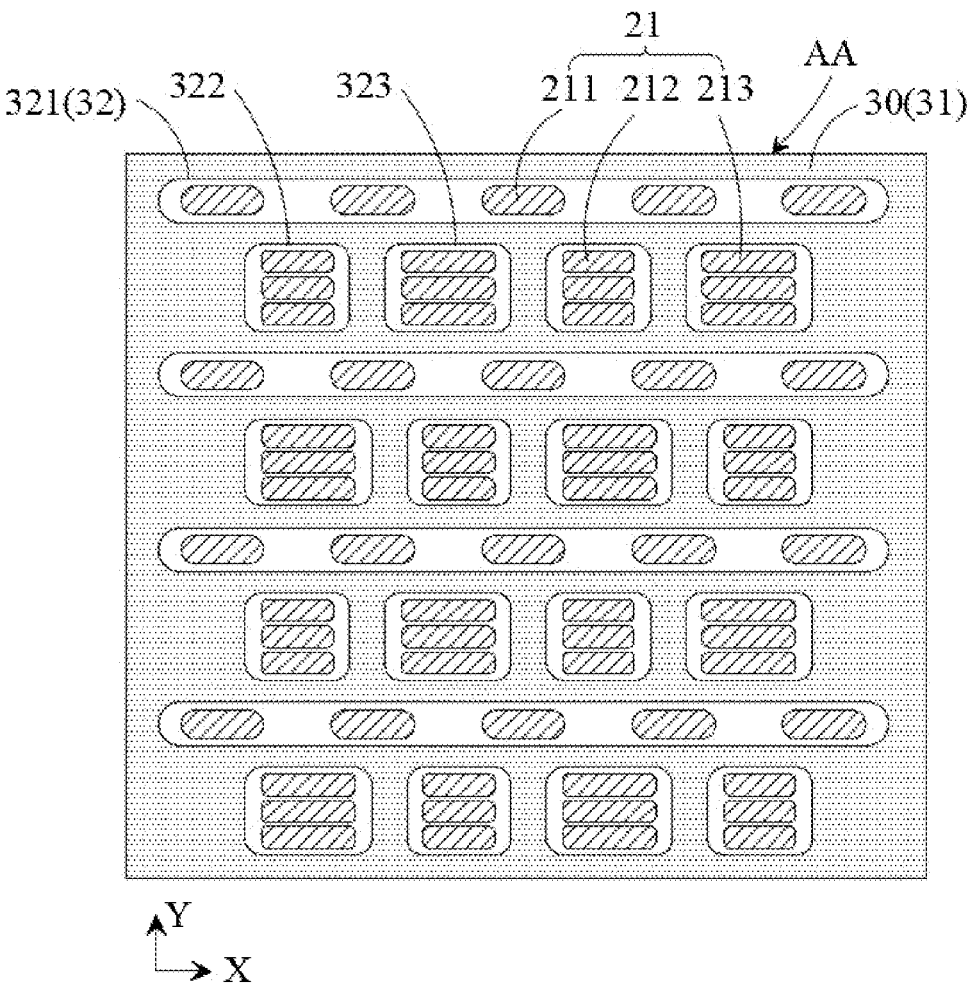
FIG. 8 is a schematic plan view of a third display panel according to an embodiment of the present application.

As shown in FIG. 8, FIG. 8 is a schematic plan view of a third display panel provided by an embodiment of the application. The structure of the third display panel shown in FIG. 8 is roughly the same as that of the second display panel shown in FIG. 7. The difference is that the second pixel opening 322 is provided with three second anode electrodes 212 spaced along the column direction Y, and the third pixel opening 323 is provided with three third anode 213 spaced along the column direction Y. That is, the second pixel opening 322 is provided with three green sub-pixels, and the third pixel opening 323 is provided with three blue sub-pixels.

Taking the second pixel opening 322 as an example, the green sub-pixel corresponding to the second anode 212 located in the middle of the three second anodes 212 may not emit light under normal circumstances. When the green sub-pixels corresponding to the second anodes 212 are damaged due to process or other reasons and cannot emit light normally, the green sub-pixels corresponding to the second anodes 212 located in the middle can replace the malfunctioning green sub-pixels.

Similarly, in the third pixel opening 323, the blue sub-pixel corresponding to the third anode 213 located in the middle of the three third anodes 213 can replace the malfunctioning blue sub-pixel, so as to avoid the problem of poor display such as dark spots in the display panel and improve the yield of the product.

Figure 9:
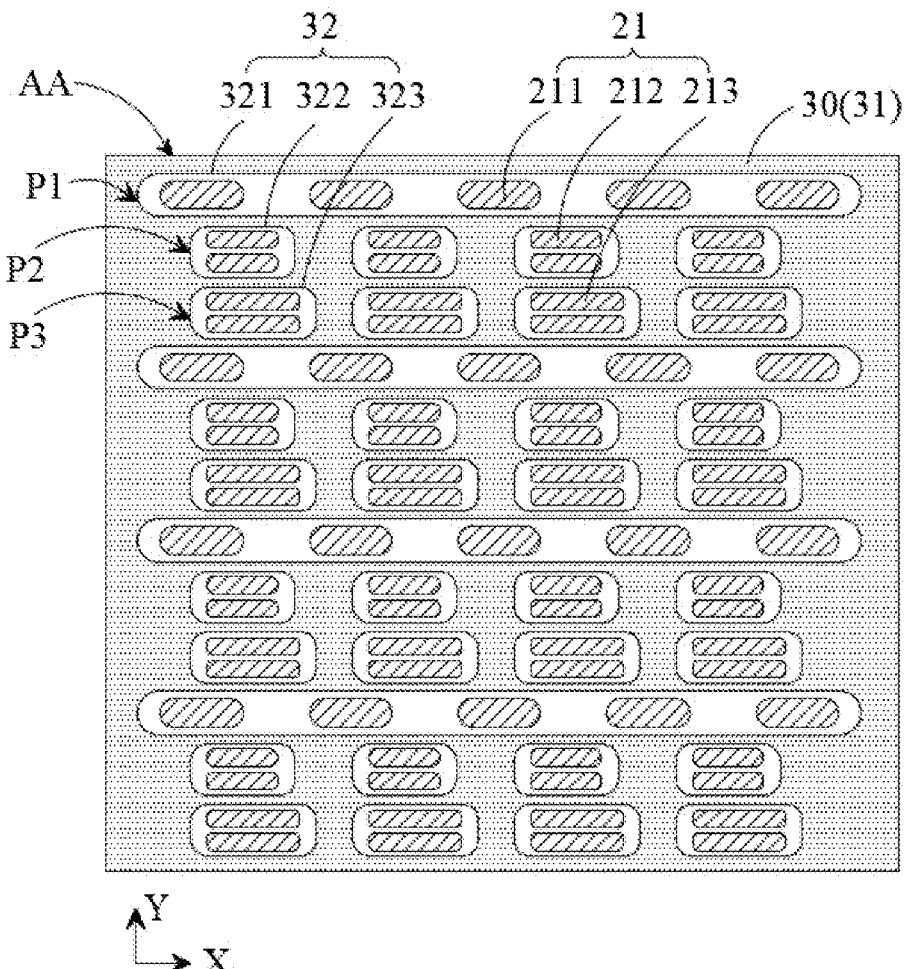
FIG. 9 is a schematic plan view of a fourth display panel according to an embodiment of the present application.

As shown in FIG. 9, FIG. 9 is a schematic plan view of a fourth display panel provided by an embodiment of the present application, and its structure is substantially the same as that of the first type of display panel shown in FIG.

1 except that the second pixel openings 322 and the third pixel openings 323 are arranged in different rows.

As shown in FIG. 9, the display area AA may be provided with a first opening row P1, a second opening row P2 and a third opening row P3 which are alternately arranged in sequence along the column direction Y. The first opening row P1 is provided with one of the first pixel openings 321, the second opening row P2 is provided with a plurality of second pixel openings 322 arranged at intervals along the row direction X, and the third opening row P3 is provided with a plurality of third pixel openings 323 arranged at intervals along the row direction X. The first opening row P1, the second opening row P2 and the third opening row P3 along the column direction Y can constitute the smallest repeating unit.

It should be noted that FIG. 9 only illustrates four repeating units therein, and the arrangement of subsequent repeating units may refer to FIG. 9, which will not be repeated here.

Beneficial effects of the embodiments of the present application are that the embodiments of the present application provide a display panel, and the display panel includes a display area, and the display panel further includes a base substrate, an anode layer disposed on the base substrate, and an anode layer disposed on the base substrate. A pixel definition layer disposed on a side of the anode layer away from the base substrate, the anode layer includes a plurality of first anodes, second anodes and third anodes, and a first pixel opening, a second anode and a third anode are arranged on the pixel definition layer. A second pixel opening and a third pixel opening, the first pixel opening extending from one end of the display area to the opposite end of the display area in the row direction, the second pixel opening and the third pixel opening, and the first pixel opening are arranged in different rows. The first pixel opening is provided with a plurality of the first anodes arranged at intervals along the row direction, and the second pixel opening is provided with the first anodes, the third anodes are provided in the third pixel opening. Through collecting the plurality of first anodes arranged at intervals along the row direction in the same first pixel opening, the number of first pixel openings in the display area can be reduced and increase the number of ink droplets that can be sprayed in a single first pixel opening, thereby reducing the risk of color mixing between adjacent pixel openings and the number of inkjet printing times, shortening inkjet printing time, and improving productivity.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display panel, comprising a display area, and the display panel further comprises:

a base substrate;

an anode layer disposed on the base substrate, wherein the anode layer comprises a plurality of first anodes, a plurality of second anodes, and a plurality of third anodes;

a pixel definition layer disposed on a side of the anode layer away from the base substrate, wherein the pixel definition layer is provided with a plurality of first pixel openings, a plurality of second pixel openings and a plurality of third pixel openings, each first pixel opening extends from one end of the display area to an opposite end of the display area along a row direction, and second pixel openings of the plurality of second pixel openings and third pixel openings of the plurality of third pixel openings are arranged in a different row than a row with a first pixel opening;

a light-emitting layer respectively disposed in the first pixel openings, the second pixel openings and the third pixel openings; and a cathode layer disposed on a side of the light-emitting layer away from the base substrate, wherein each first pixel opening is provided with first anodes of the plurality of the first anodes arranged at intervals along the row direction, each second pixel opening is provided with second anodes of the plurality of the second anodes, and each third pixel opening is provided with third anodes of the plurality of the third anodes;

wherein the display area is provided with a plurality of first opening rows and a plurality of second opening rows that are alternately arranged in sequence along a column direction, each first opening row of the plurality of first opening rows is provided with one first pixel opening of the plurality of first pixel openings, and each second opening row of the plurality of second opening rows is provided with second pixel openings of the plurality of second pixel openings and third pixel openings of the plurality of the third pixel openings;

wherein the second pixel openings in any one of the plurality of second opening rows are staggered from the second pixel openings in the adjacent second opening rows, and the third pixel openings in any one of the plurality of second opening rows are staggered from the third pixel openings in the adjacent second opening rows;

wherein a length of the second pixel openings along the row direction is smaller than a length of the third pixel openings along the row direction; centerlines of the first anodes in the adjacent first opening rows are overlapped; and a centerline of each of the first anodes along the column direction is extended through a middle of a horizontal line connecting centers of one of the second anodes adjacent to the first anode and one of the third anodes adjacent to the first anode.

2. The display panel of claim 1, wherein the second pixel opening is provided with at least two second anodes arranged at an interval along the column direction, and the third pixel opening is provided with at least two third anodes arranged at an interval along the column direction.

3. The display panel of claim 1, wherein a width of the first pixel openings along the column direction is different from a width of the second pixel openings along the column direction, and the width of the first pixel openings along the column direction is different from a width of the third pixel openings along the column direction.

4. The display panel of claim 3, wherein the width of the first pixel openings along the column direction is smaller than the width of the second pixel openings along the column direction, and the width of the second pixel openings along the column direction is the same as the width of the third pixel openings along the column direction.

5. The display panel of claim 1, wherein a distance between a first pixel opening and an adjacent second pixel opening along the column direction or between the first pixel opening and an adjacent third pixel opening along the column direction is between 10 μm and 16 μm.

6. The display panel of claim 1, wherein a distance between a second pixel opening and a third pixel opening adjacent in the row direction is between 15 μm and 25 μm.

7. The display panel of claim 1, wherein a color of light emitted by the light emitting layer corresponding to the first pixel openings, a color of light emitted by the light emitting layer corresponding to the second pixel openings, and a color of light emitted by the light emitting layer corresponding to the third pixel openings are different.

8. The display panel of claim 1, wherein the display panel further comprises a driving circuit layer, the driving circuit layer is arranged on the base substrate, and the anode layer is arranged on a side of the driving circuit from away from the base substrate, wherein the driving circuit layer comprises a plurality of thin film transistors, and each first anode of the plurality of first anodes, each second anode of the plurality of the second anodes and each third anode of the plurality of the third anodes are respectively electrically connected to a corresponding different thin film transistor.

\* \* \* \* \*